US006933192B1

(12) United States Patent  (10) Patent No.: US 6,933,192 B1
Divakaruni et al.  (45) Date of Patent: Aug. 23, 2005

(54) METHOD FOR FABRICATING A TRENCH HAVING A BURIED DIELECTRIC COLLAR

(75) Inventors: Ramachandra Divakaruni, Ossining, NY (US); Ravikumar Ramachandran, Pleasantville, NY (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,472

(22) Filed: May 7, 2004

(51) Int. Cl.[7] .......................................... H01L 21/8242
(52) U.S. Cl. ....................... 438/243; 438/248; 438/391
(58) Field of Search ............................. 438/243–249, 438/386–392

(56) References Cited

U.S. PATENT DOCUMENTS 6,373,086 B1 *  4/2002  Mandelman et al. ....... 257/301
6,599,798 B2 *  7/2003  Tews et al. ................. 438/249

* cited by examiner

*Primary Examiner*—H. Jey Tsai
(74) *Attorney, Agent, or Firm*—Schmeiser, Olsen & Watts; Steven Capella

(57) ABSTRACT

A method of forming a buried dielectric collar around a trench and of forming a trench capacitor, the buried dielectric collar formed by: (a) forming the trench in a substrate; (b) forming a multilayer coating on sidewalls and a bottom of the trench; (c) removing a continuous band of the multilayer coating from the sidewalls a fixed distance from a top of the trench to expose a continuous band substrate in the sidewalls of the trench; (d) etching, in said exposed band of substrate, a lateral trench extending into said substrate in said sidewalls of said trench; and (e) filling the lateral trench with a dielectric material to form the buried dielectric collar. The trench capacitor is formed by filling the trench or its variants with polysilicon.

20 Claims, 15 Drawing Sheets

US 6,933,192 B1

METHOD FOR FABRICATING A TRENCH HAVING A BURIED DIELECTRIC COLLAR

BACKGROUND OF INVENTION

The present invention relates to the field of semiconductor device fabrication; more specifically, it relates to a method fabricating a trench and a trench capacitor having buried dielectric collars.

One use for trench capacitors is for the storage node of dynamic random access memory (DRAM) cells. In such applications there are parasitic sidewall leakage currents from a bitline of the DRAM cell to the storage node and from the storage node to the substrate. Buried dielectric collars are used to reduce these leakages. However, present schemes for forming buried collars are limited in the width of the collar formed (and thus limit leakage reduction) and are difficult to scale as trench widths decrease. Therefore, there is a need for a scalable buried dielectric collar process and reduced leakage trench capacitor using a buried dielectric collar.

SUMMARY OF INVENTION

A first aspect of the present invention is a method of forming a buried dielectric collar around a trench, comprising: (a) forming the trench in a substrate; (b) forming a multilayer coating on sidewalls and a bottom of the trench; (c) removing a continuous band of the multilayer coating from the sidewalls a fixed distance from a top of the trench to expose a continuous band of substrate in the sidewalls of the trench; (d) etching, in the exposed band of substrate, a lateral trench extending into the substrate in the sidewalls of the trench; and (e) filling the lateral trench with a dielectric material to form the buried dielectric collar.

A second aspect of the present invention is a method of forming a trench capacitor, comprising: (a) forming a trench in a substrate; (b) forming a multilayer coating on sidewalls and a bottom of the trench; (c) removing a continuous band of the multilayer coating from the sidewalls a fixed distance from a top of the trench to expose a continuous band of substrate in the sidewalls of the trench; (d) etching, in the exposed band of substrate, a lateral trench extending into the substrate in the sidewalls of the trench; (e) filling the lateral trench with a dielectric material to form the buried dielectric collar; (f) filling the trench with polysilicon.

A third aspect of the present invention is a method of forming a buried dielectric collar around a trench, comprising: (a) forming the trench in silicon substrate; (b) forming a multilayer coating on sidewalls and a bottom of the trench, the multilayer coating comprises in order from the substrate outward, a layer of silicon oxide, a first layer of silicon nitride, a layer of polysilicon and a second layer of silicon nitride; (c) forming a first resist fill a first distance from a top of the trench; (e) removing the first silicon nitride layer not protected by the first resist fill exposing a upper portion of the polysilicon layer and oxidizing an outer layer of the upper portion of the polysilicon layer to form a second silicon oxide layer on the polysilicon layer and then removing the first resist fill; (f) forming a second resist fill a second distance from a top of the trench, the second distance being greater than the first distance; (g) removing in the order recited, (i) between the second silicon oxide layer and a top surface of the second fill resist, a continuous band of the second silicon nitride layer, a continuous band of the polysilicon layer, a continuous band of the first silicon nitride layer and a continuous band of the first silicon oxide layer to expose a continuous band of substrate in the sidewalls of the trench and the second resist fill or (ii) between the second silicon oxide layer and a top surface of the second fill resist, a continuous band of the second silicon nitride layer, a continuous band of the polysilicon layer and a continuous band of the first silicon nitride layer and then removing the second fill resist and the first silicon oxide layer to expose a continuous band of substrate in the sidewalls of the trench; (h) etching, in the exposed band of substrate, a lateral trench extending into the substrate in the sidewalls of the trench; and (i) filling the lateral trench with a dielectric material to form the buried dielectric collar.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1:
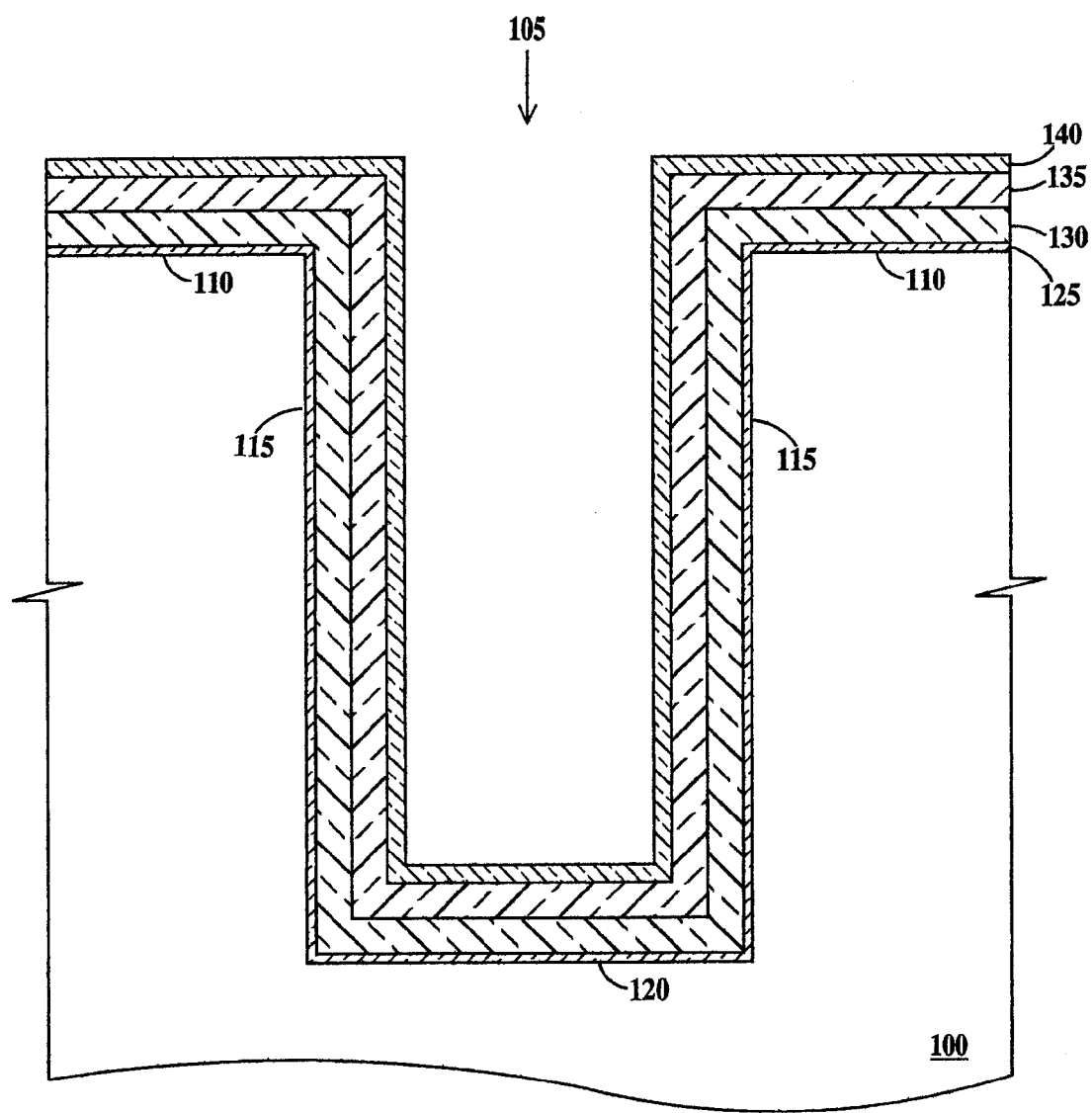
FIGS. 1 through 11 are partial cross-sectional views illustrating fabrication of a trench having a buried dielectric collar according to the present invention.

FIGS. 1 through 11 are partial cross-sectional views illustrating fabrication of a trench having a buried dielectric collar according to the present invention. In FIG. 1, formed in a substrate 100 is a trench 105. Substrate 100 may be a bulk silicon substrate or a silicon-on-insulator (SOI) substrate. Substrate 100 may include an uppermost epitaxial silicon layer. For the purposes of the present invention, a silicon substrate is defined as a bulk silicon substrate, the silicon layer of a SOI substrate, an uppermost epitaxial silicon layer formed on either a bulk or SOI substrate or a silicon layer formed on a substrate of any other material. Trench 105 may be formed by any number of anistropic etch processes, such as plasma etching and reactive ion etching (RIE), known in the art using a hard mask that is lithographically defined. A top surface 110 of substrate 100 defines a horizontal or lateral direction and a vertical direction is defined as a direction perpendicular to the horizontal direction. Trench 105 includes sidewalls 115 and a bottom 120. Formed on top surface 110 of substrate 100, sidewalls 115 and bottom 120 of trench 105 is a silicon oxide layer 125. Formed over silicon oxide layer 125, including over those portions of the silicon oxide layer formed in trench 105, is a first silicon nitride layer 130. Formed over first silicon nitride layer 130, including over those portions of the first silicon nitride layer formed in trench 105, is a polysilicon layer 135. Formed over polysilicon layer 135, including over those portions of the polysilicon layer formed in trench 105, is a second silicon nitride layer 140.

Silicon oxide layer 125 may be formed by thermal oxidation of substrate 100 after trench 105 has been formed and the hard mask used to define the trench removed. Alternatively, the hard mask may be incorporated into that portion of silicon oxide layer 125 contacting top surface 110 of substrate 100. First silicon nitride layer 130, polysilicon layer 135 and second silicon nitride layer 140 are conformal coatings and may be formed by any number of methods, such as chemical-vapor deposition (CVD), low pressure chemical-vapor deposition (LPCVD) and plasma enhanced chemical-vapor deposition (PECVD) known in the art.

In one example, silicon oxide layer 125 is about 20 to 50 Å thick, first silicon nitride layer 130 is about 80 Å or greater thick, polysilicon layer 135 is about 200 Å or less thick and second silicon nitride layer 140 is about 40 to 80 Å thick.

Figure 2:
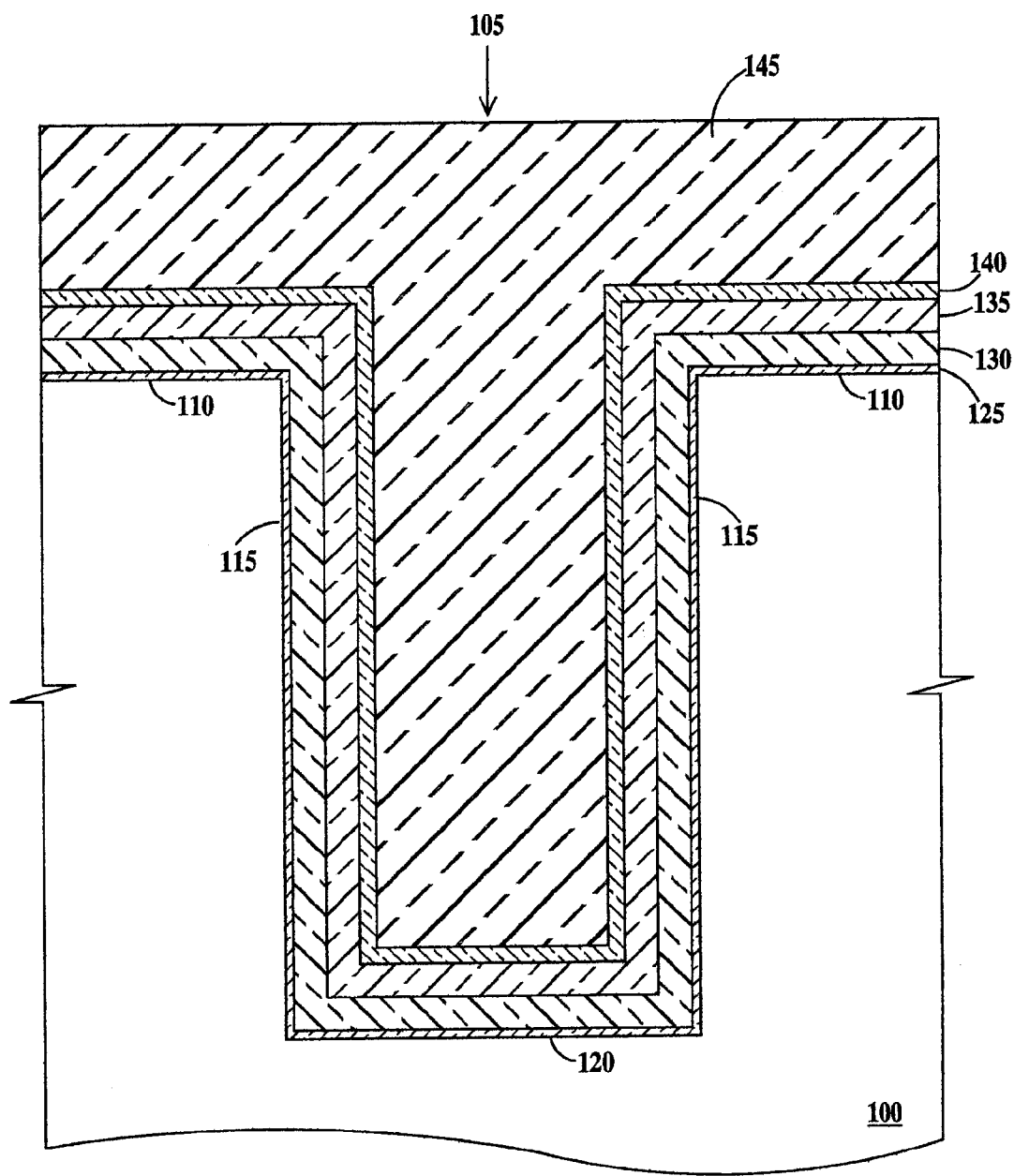
Figure 3:
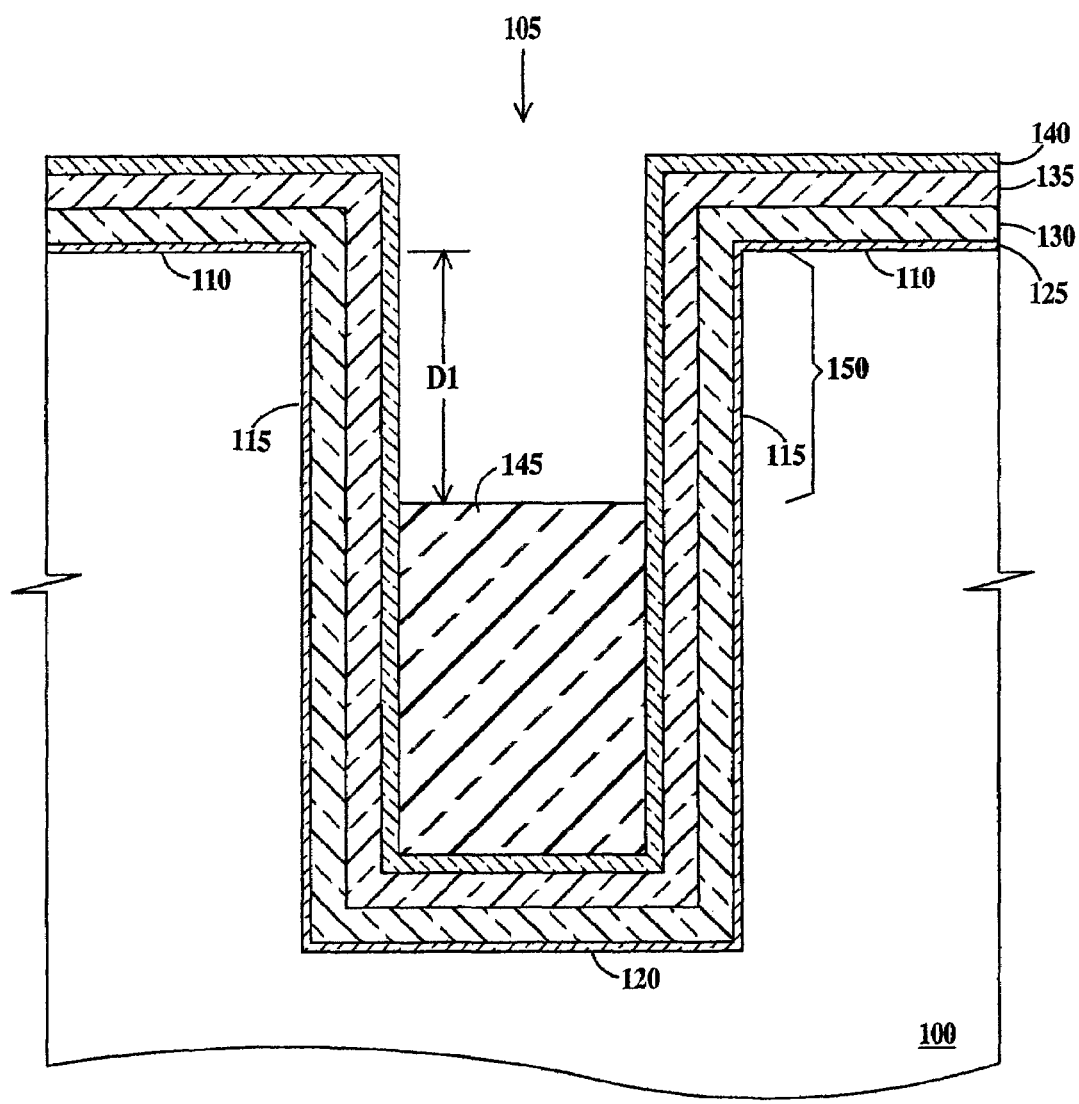
Figure 4:
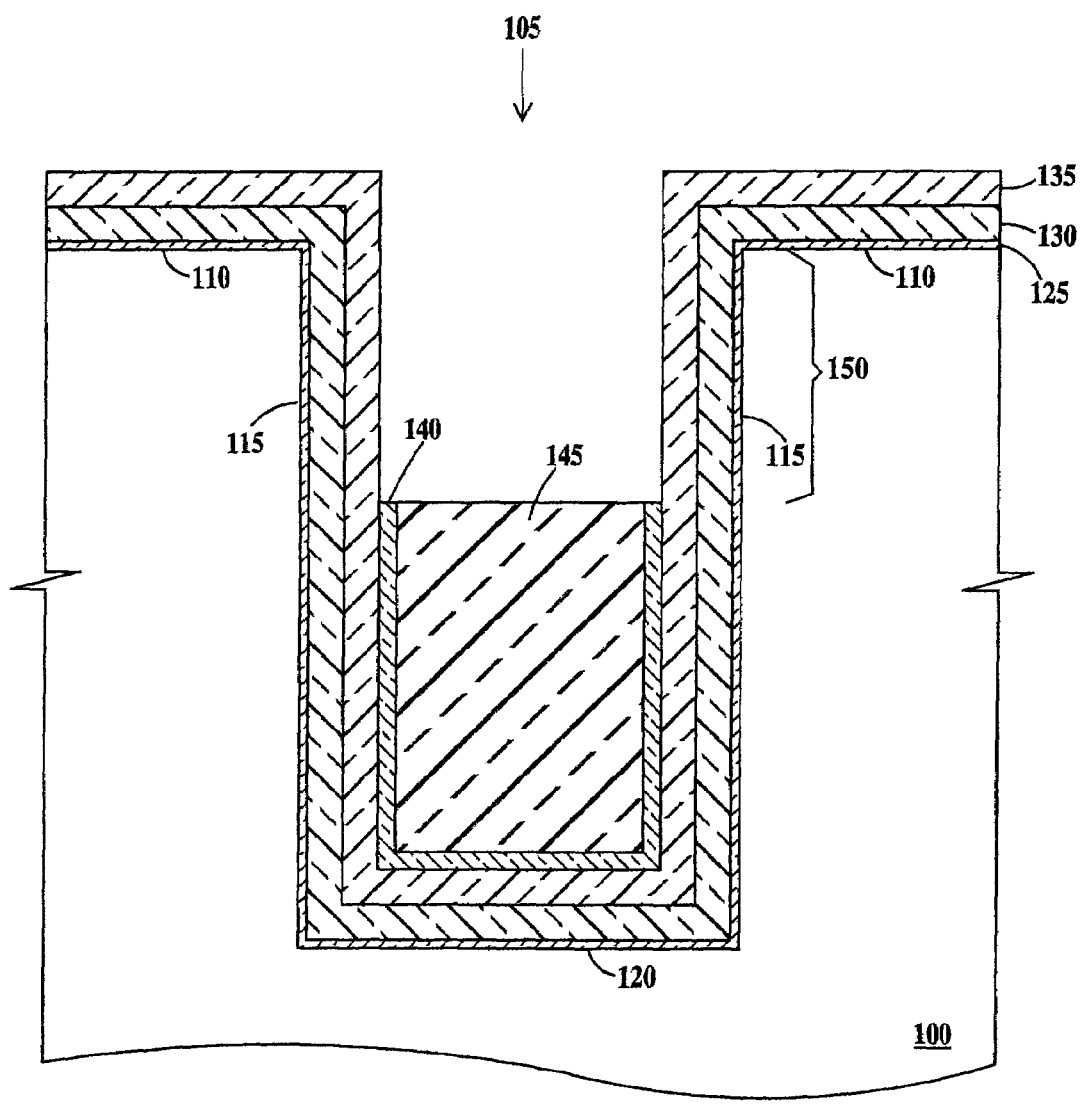
Figure 5:
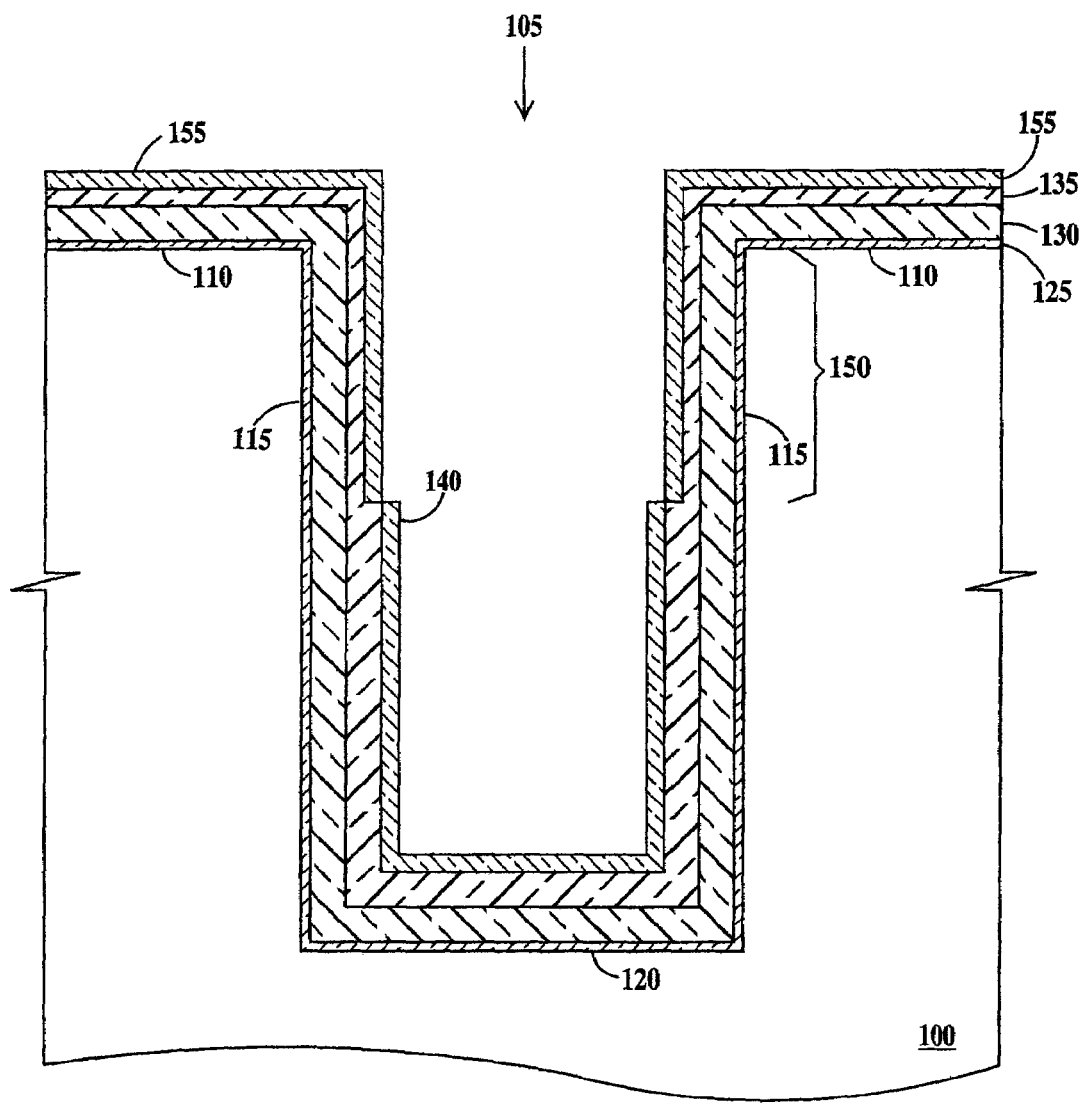

In FIG. 2, a layer of resist 145 is formed on second silicon nitride layer 140 and completely fills trench 105. In FIG. 3, resist layer 145 is recessed to a depth D1 measured from top surface 110 of silicon substrate 100. Depth D1 defines an upper region 150 of trench 105. Depth D1 may be selected to correspond to the bottom of a P-well formed in an upper region of substrate 100 in which an NFET of a DRAM memory cell will be formed. In one example D1 is about 0.6 to 1.0 microns. In FIG. 4, a portion of second silicon nitride layer 140, not protected by resist layer 145 is removed, for example, by chemical downstream etch (CDE) or other plasma based etching process, thus exposing polysilicon layer 135 in upper region 150 of trench 105. In FIG. 5, resist layer 145 (see FIG. 4) is removed, for example, by a plasma strip process and exposed surfaces (those not covered by second silicon nitride layer 140) of polysilicon layer 135 are thermally oxidized to form a silicon oxide layer 155. About half of the thickness of polysilicon layer 135 is converted to oxide in upper region 150 of trench 105 over top surface 110 of silicon substrate 100.

Figure 6:
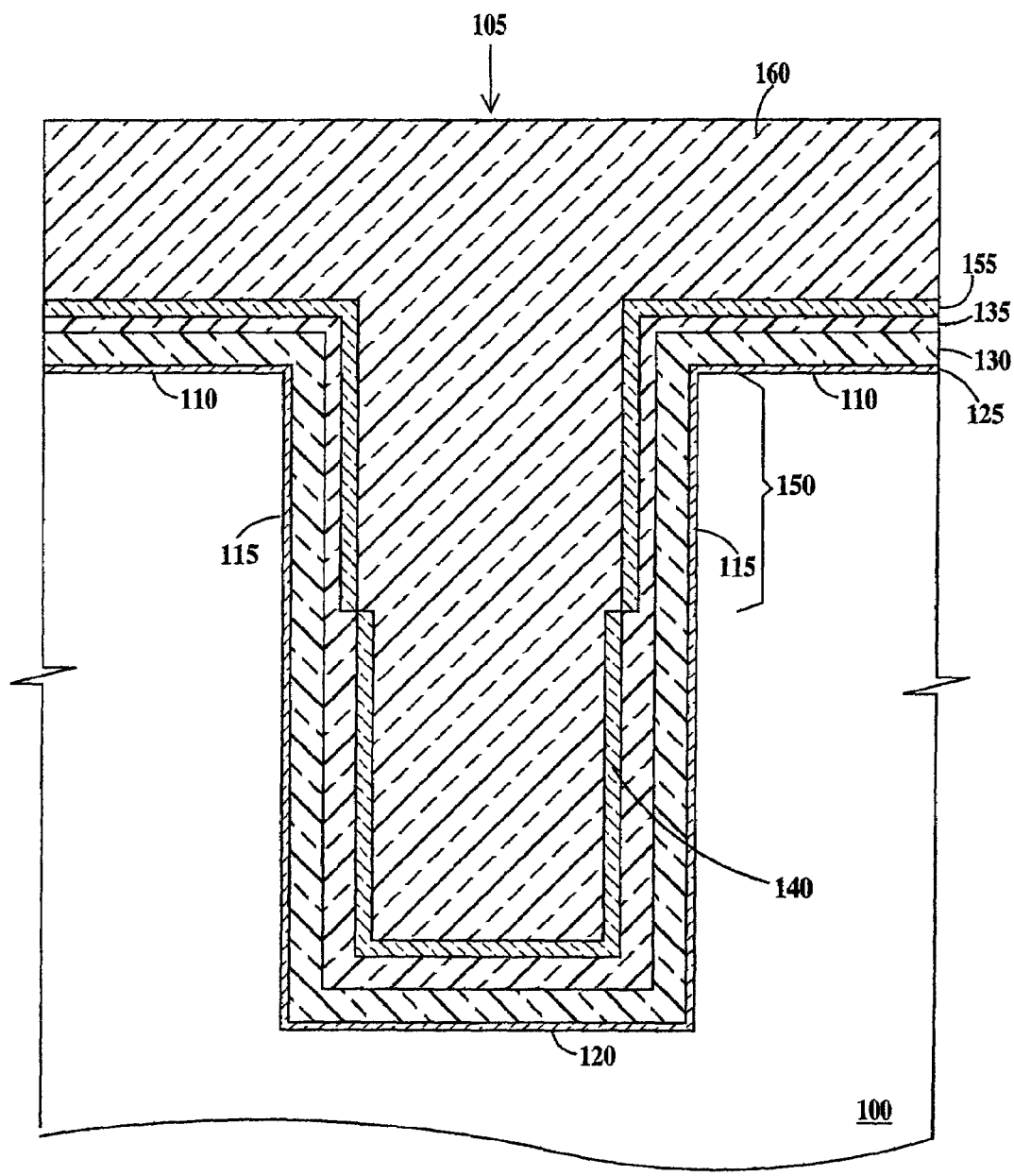
Figure 7:
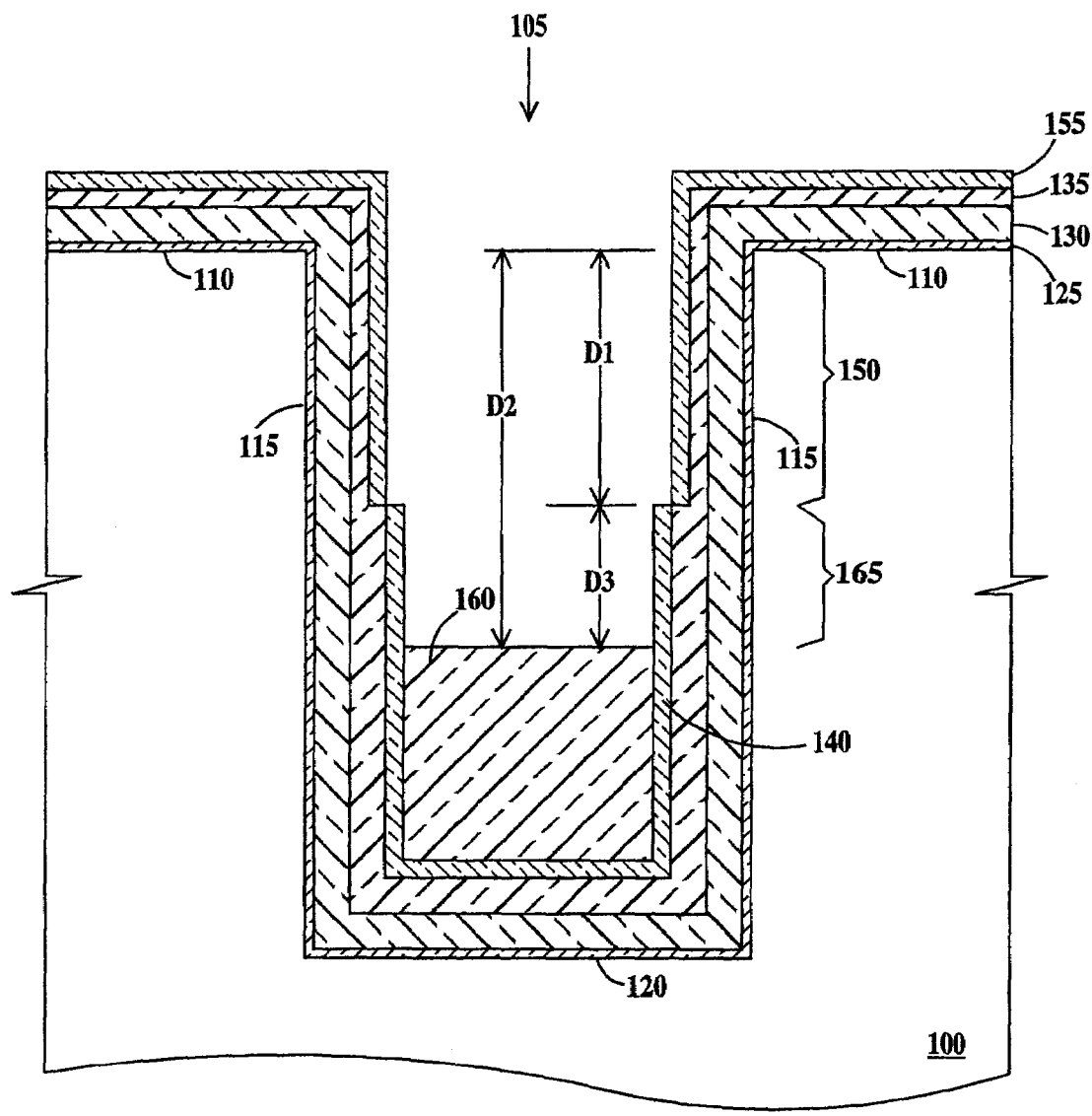

In FIG. 6, layer of resist 160 is formed on silicon oxide layer 155 and on remaining second silicon nitride layer 140 in trench 105. Resist layer 160 completely fills trench 105. In FIG. 7, resist layer 160 is recessed to a depth D2 measured from top surface 110 of silicon substrate 100. The difference D3 between depths D1 and D2 defines middle region 165 of trench 105. Depth D2 may be selected to correspond to the top of an N+ buried diffused plate often used to isolate DRAM memory cells. In one example D2 is about 1.3 to 1.7 microns.

Figure 8:
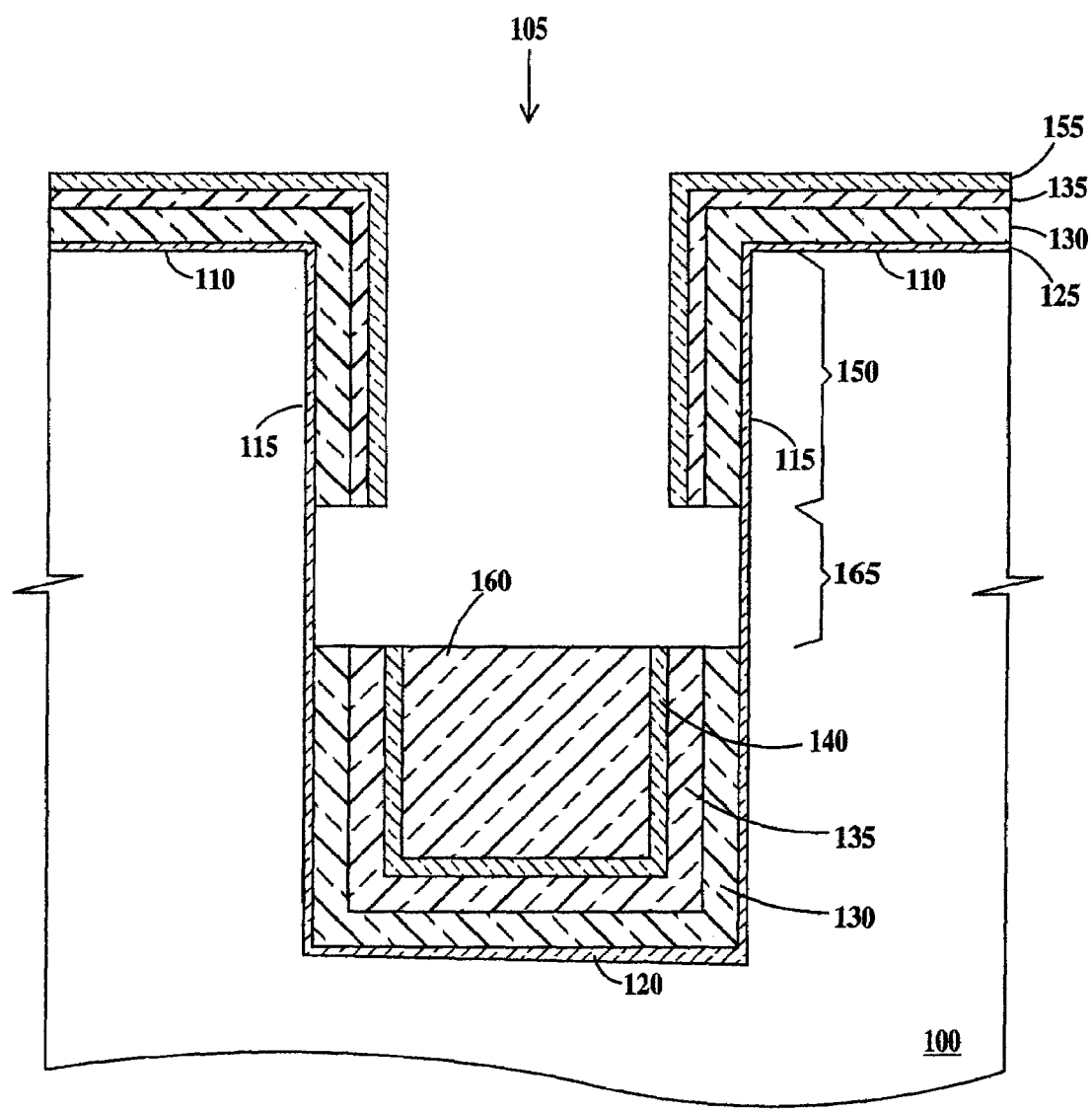

In FIG. 8, a portion of second silicon nitride layer 140, not protected by resist 160 is removed, for example, by a CDE or other plasma based etching process selective silicon nitride to silicon oxide, thus exposing polysilicon layer 135 in middle region 165 of trench 105. Next, exposed polysilicon layer 135 in middle region 165 of trench 105 is removed, for example, by a CDE or other plasma based etching process selective silicon to silicon oxide, thus exposing first silicon nitride layer 130 in middle region 165 of trench 105. Next, exposed first silicon nitride layer 130 in middle region 165 of trench 105 is removed, for example, by a CDE or other plasma based etching process selective silicon nitride to silicon oxide, thus exposing silicon oxide layer 125 in middle region 165 of trench 105.

Figure 9:
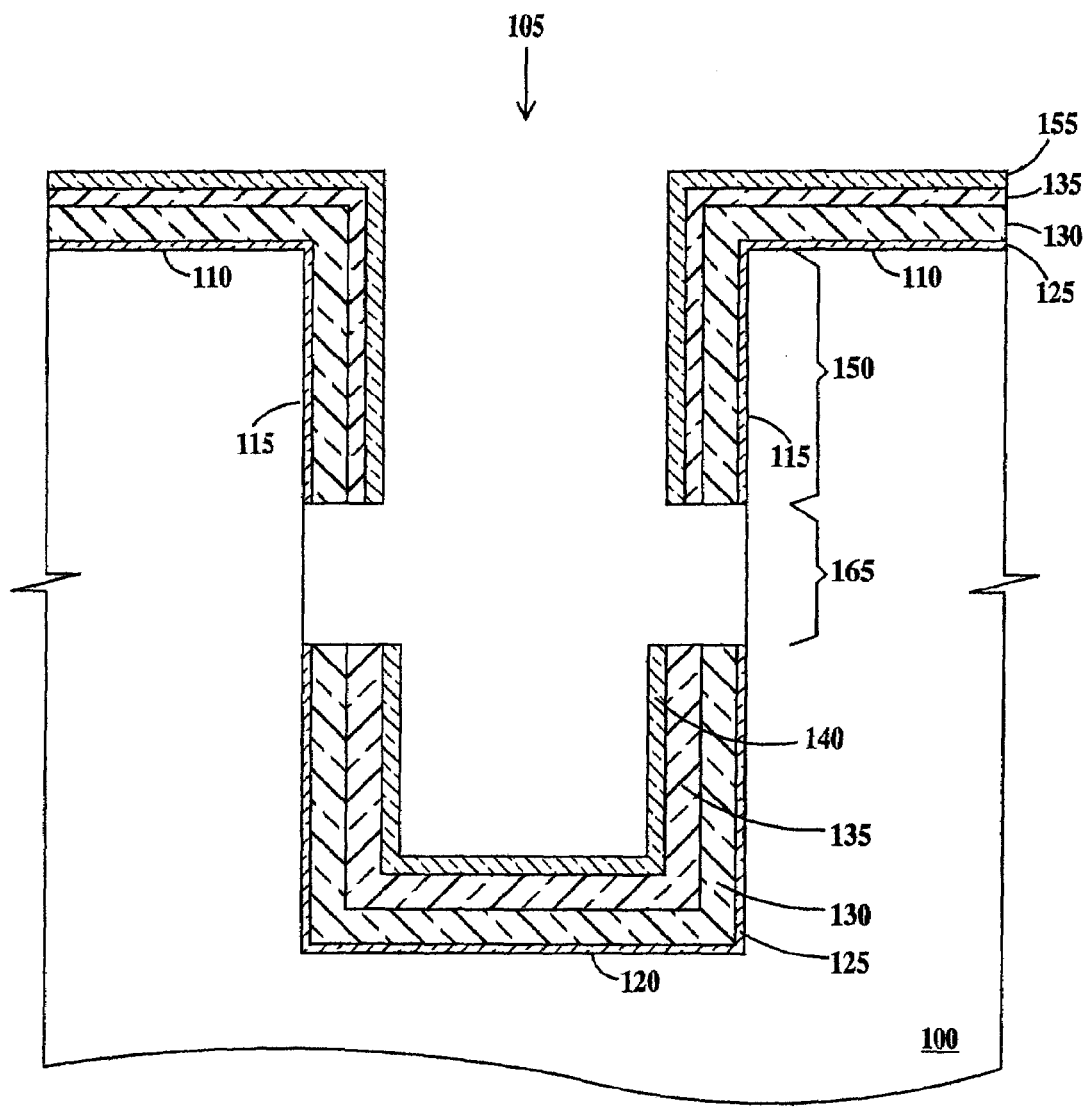

In FIG. 9, resist 160 (see FIG. 8) is removed by, for example, by a plasma strip process and the exposed region of silicon oxide layer 125 in middle region 165 of trench 105 is removed using, for example using a 40:1 (HF to water) BHF etch. Silicon oxide layer 125 may also be removed using a dry etch. A small amount of silicon oxide layer 155 is also removed, but some of silicon oxide layer 155 remains because silicon oxide layer 155 is thicker than silicon oxide layer 125. Alternatively, resist layer 160 (see FIG. 8) may be removed after the removal of silicon oxide layer 125 in middle region 165 of trench 105. In either case, sidewall 115 of trench 105 in middle region 165 of the trench is exposed. The region of removed silicon oxide layer 125, removed first silicon nitride layer 130, removed polysilicon layer 135 and removed second silicon nitride layer 140 extends in a continuous band on all sidewalls of trench 105 and the vertical extent of which is defined by middle region 165 where a buried collar will be formed as described infra.

Figure 10:
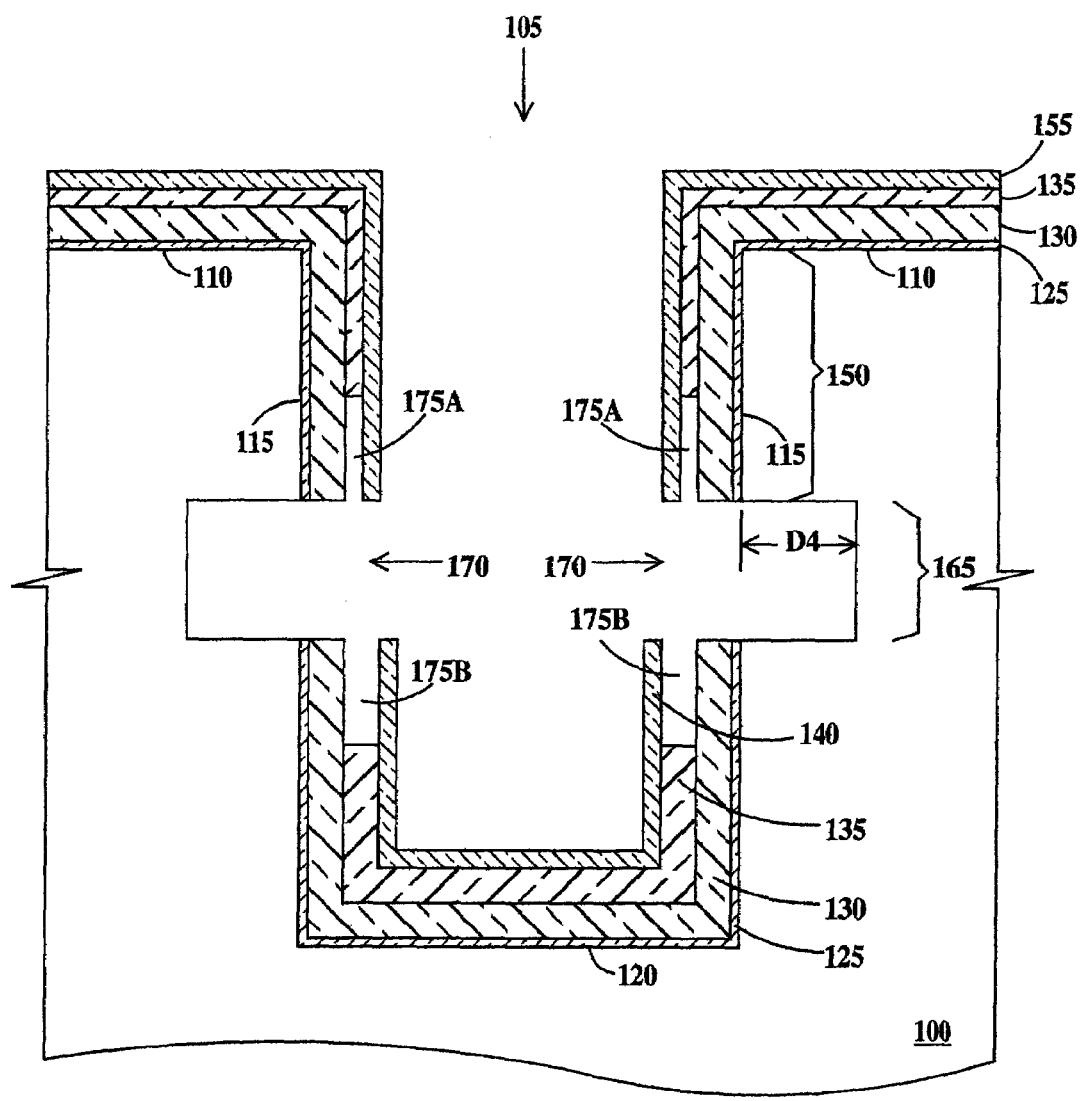

In FIG. 10, a lateral trench 170 is etched into sidewalls 115 in middle region 165 of trench 105 a distance D4. In one example, D4 may be selected to give, after the process illustrated in FIG. 11 and described infra, a filled lateral trench wide enough (in the horizontal direction to reduce parasitic leakages associated with subsequent structures, such as a trench capacitor. In a second example D4 may be selected to allow filled lateral trenches 170 of adjacent trenches 105 to contact one another after filling the lateral trenches with dielectric material using the process illustrated in FIG. 11 and described infra. At the same time silicon substrate 100 is etched, by a CDE or other plasma based etching process selective silicon to silicon oxide, to form lateral trenches 170 polysilicon layer 130 is also etched forming voids 175A between first silicon nitride layer 130 and silicon oxide layer 155. Voids 175B between first silicon nitride layer 130 and second silicon nitride layer 140 are formed simultaneously with voids 175A.

Figure 11:
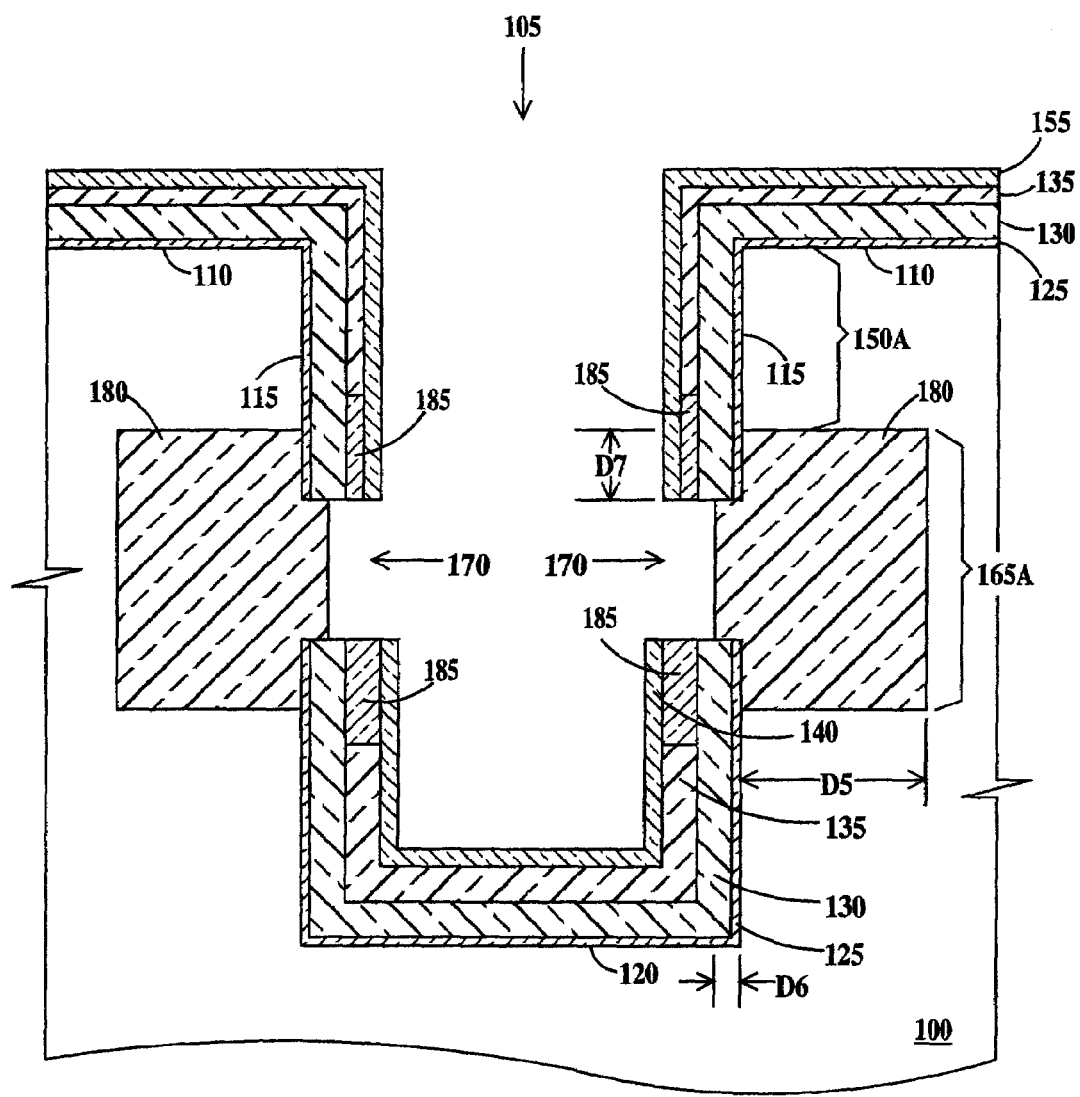

In FIG. 11, a thermal local oxidation of silicon (LOCOS) process is performed to oxidize all exposed silicon surfaces and fill lateral trenches 170 with silicon oxide forming buried dielectric collar 180. Buried dielectric collar 180 extends outward (and inward to a lesser degree) on all sidewalls of trench 105, and is continuous thus forming a ring or collar. If trench 105 is circular, then buried dielectric collar 180 has the form of an annular ring. The thermal oxidation results in an increase in volume of the consumed silicon; the oxide thus formed being about 60% into the silicon substrate and about 40% exterior to the silicon substrate. It is this 40% that fills lateral trench 170. Thus, buried dielectric collar 180 extends a distance D5 (where D5>D4, see FIG. 10) into silicon substrate 100 from sidewalls 115, a distance D6 into trench 105 from sidewalls 115 and extends above and below lateral trench 170 in silicon substrate 100 a distance D7 due to conversion of silicon to silicon oxide. Consequentially, upper region 150 of FIG. 10 has shrunk in vertical extent to form upper region 150A of FIG. 11 and middle region 165 of FIG. 10 has expanded in vertical extent to form middle region 165A of FIG. 11. In one example, D5 is about 125 nm. There is also oxidation of exposed polysilicon layer 140 to form silicon oxide plugs 185.

At this point fabrication of a lateral trench having a buried dielectric collar is completed. Continuing fabrication steps will be directed to forming a trench capacitor starting with the structure illustrated in FIG. 11. There are many alternative process schemes possible from this point onward in the formation of a trench capacitor. For example, in the structure illustrated in FIG. 11, the polysilicon layer and the dielectric layers in the trench may be removed and new dielectric layers formed on the sidewalls and bottom of the trench, then the trench filled with doped polysilicon and CMP process performed to remove excess doped polysilicon from the surface of the substrate. Therefore, the fabrication steps illustrated in FIGS. 12 through 15 should be considered exemplary.

Figure 12:
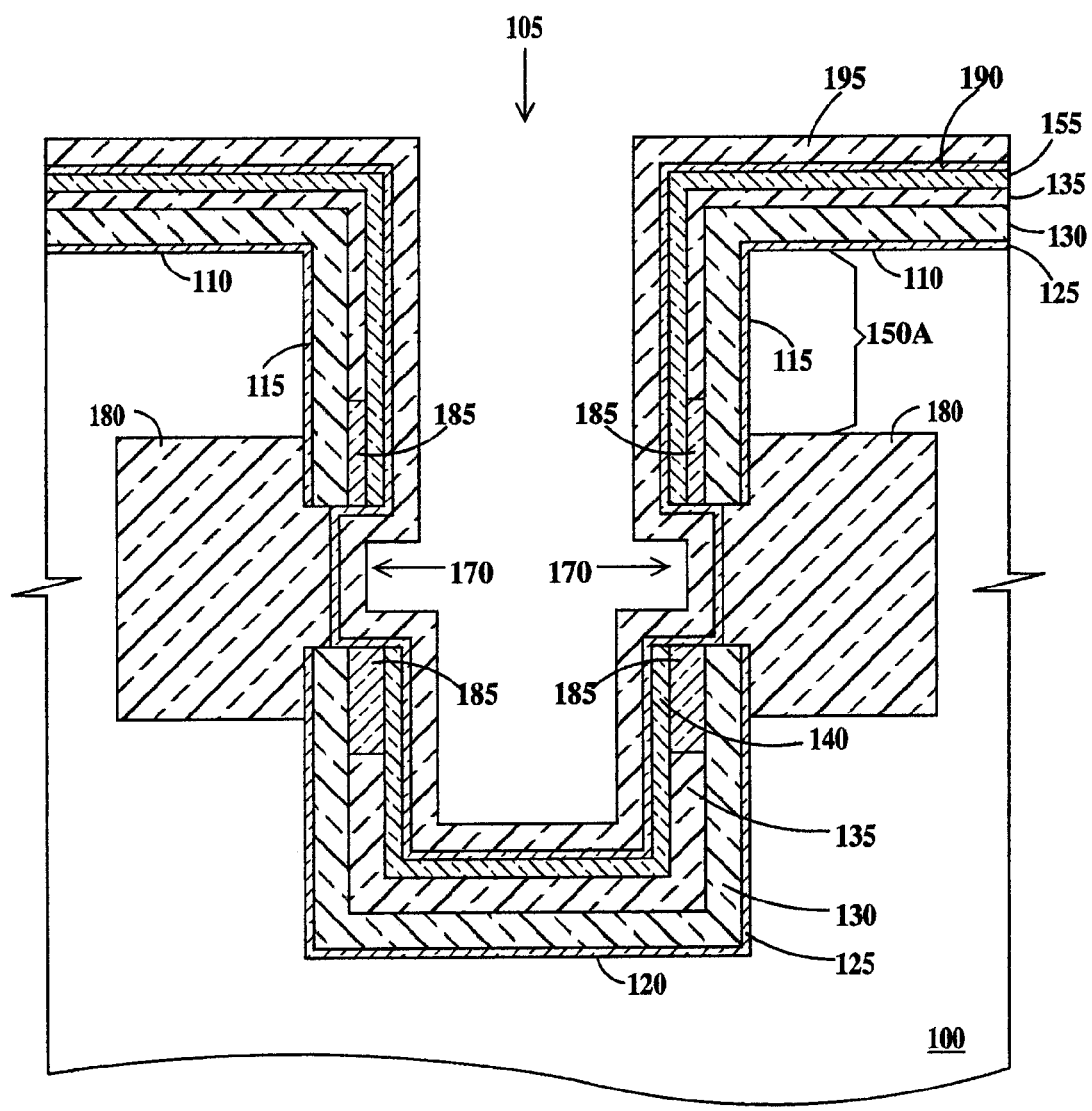
FIGS. 12 through 15 are partial cross-sectional views illustrating further fabrication steps for forming a bottle trench capacitor according to the present invention.

FIGS. 12 through 15 are partial cross-sectional views illustrating further fabrication steps for forming a bottle trench capacitor according to the present invention. In FIG. 12, a conformal third layer of silicon nitride 190 followed by a conformal layer of oxide 195 are deposited over exposed surfaces of first silicon nitride layer 130, polysilicon layer 135, second silicon nitride layer 140, silicon oxide layer 155 and buried dielectric collar 180. Third silicon nitride layer 190 protects silicon oxide layer 155 in region 150A of trench 105 from subsequent etch steps. Oxide layer 195 protects exposed first silicon nitride layer 130 in lateral trenches from subsequent etch processes. In one example third silicon nitride layer 190 is less than about 40 Å thick and oxide layer 195 is greater than about 100 Å. In one example oxide layer 195 is tetraethoxysilane (TEOS) oxide.

Figure 13:
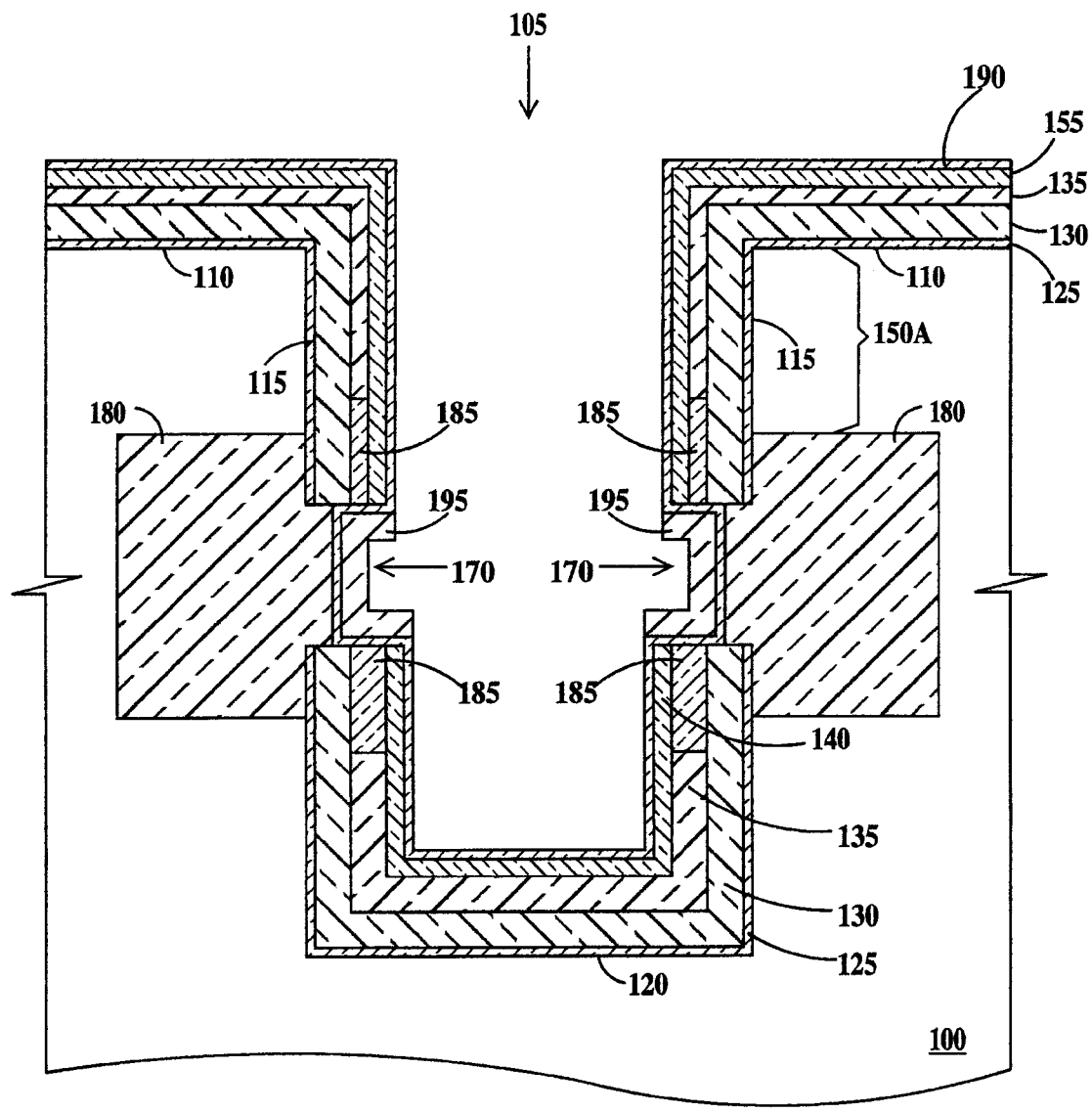

In FIG. 13, oxide layer 195 is etched, by a CDE or other plasma based etching process selective silicon oxide to silicon nitride, to remove oxide layer 195 of all surfaces except those in lateral trenches 170.

Figure 14:
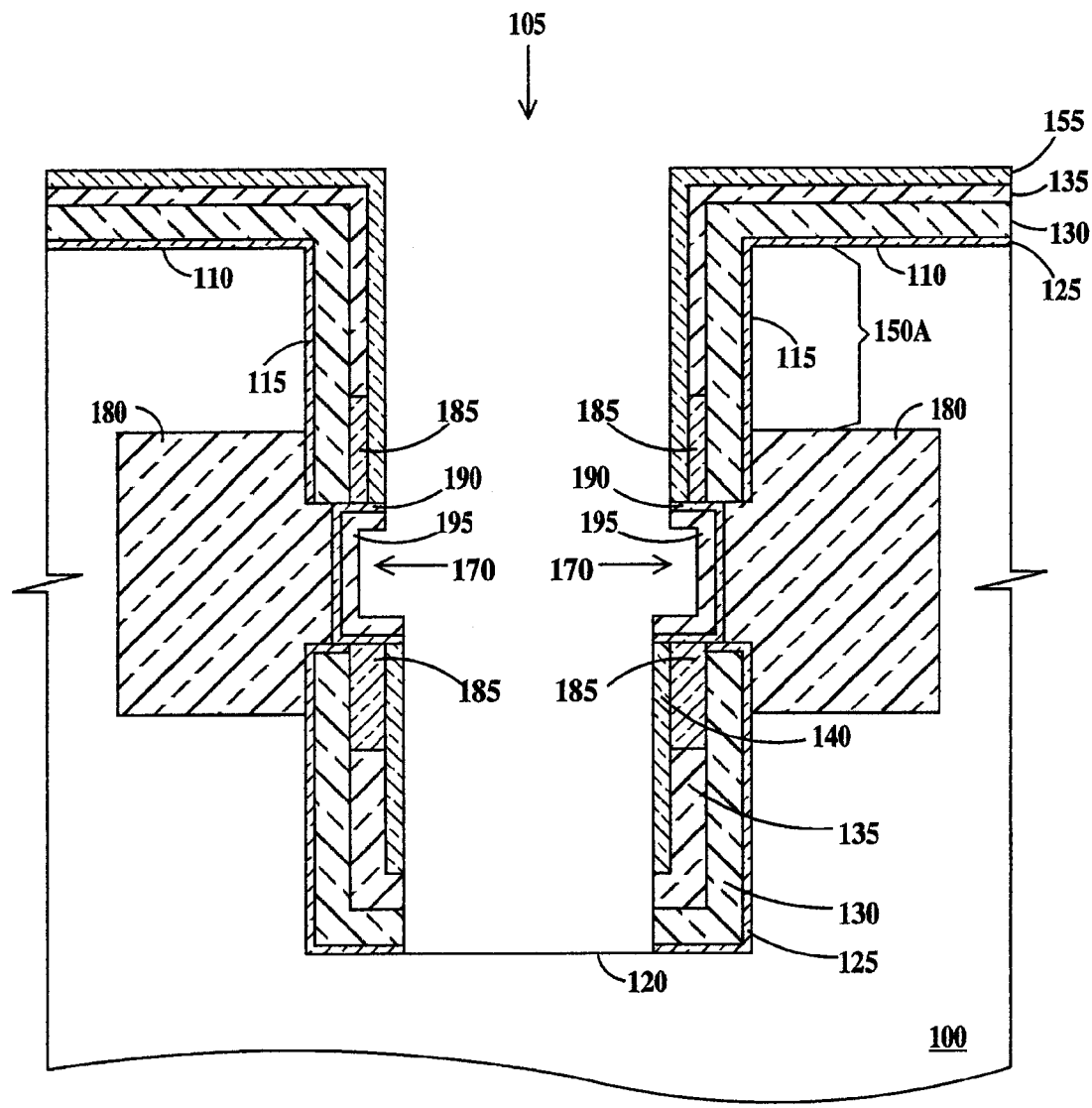

In FIG. 14, all exposed third silicon nitride layer 190 as well as portions of second silicon nitride layer 140, polysilicon layer 135, and first silicon nitride layer 130 over bottom 120 of trench 105 are removed by a one or more CDE or other plasma based etching processes selective silicon nitride/polysilicon to silicon oxide. Silicon oxide layer 125 over bottom 120 of trench 105 is removed using, for example using a 40:1 (HF to water) BHF etch. Silicon oxide layer 125 may also be removed using a dry etch.

Figure 15:
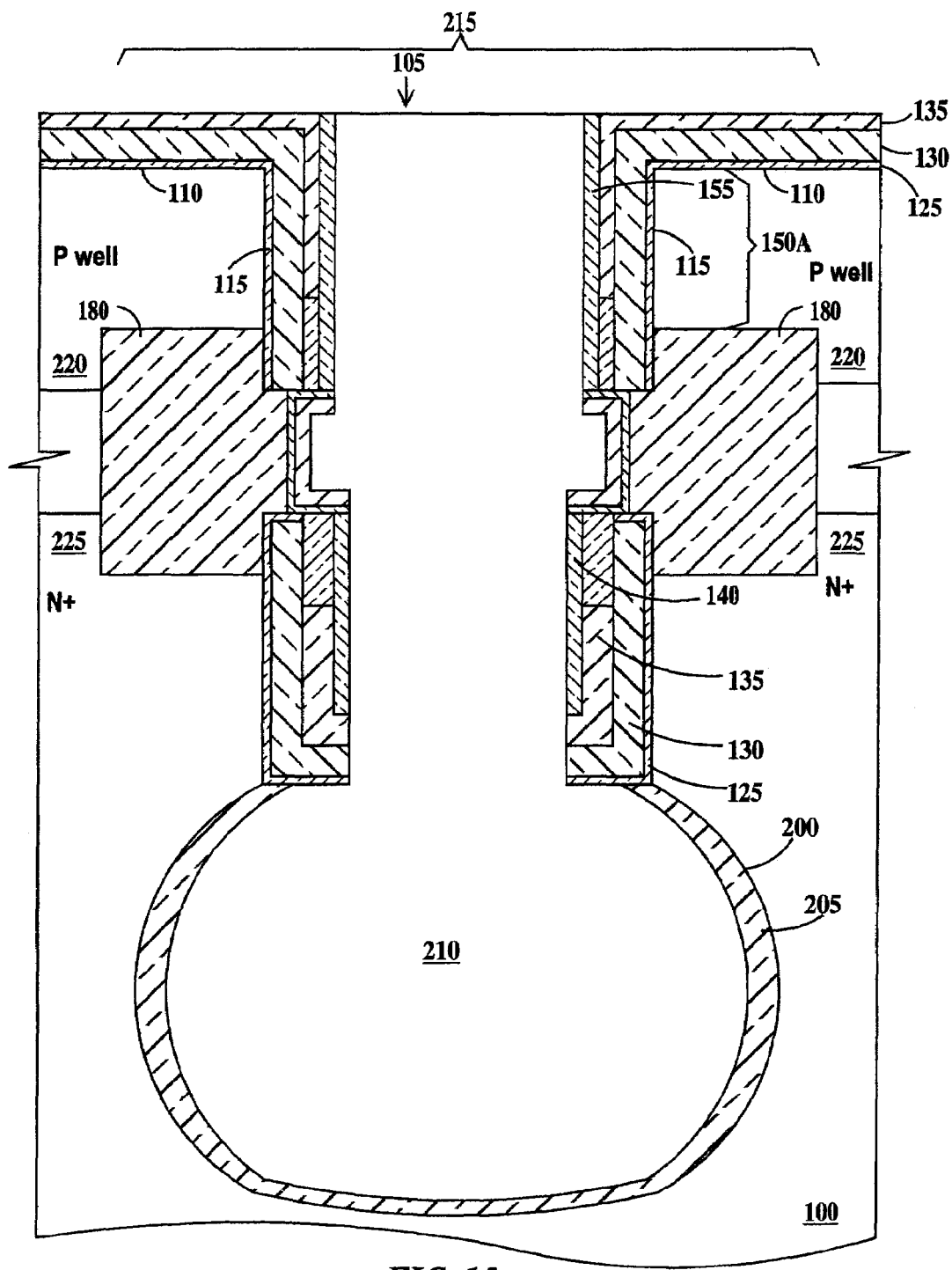

In FIG. 15, a cavity 200 is isotropically etched into substrate 100 using a CDE or other plasma based etching process selective silicon to silicon oxide. A dielectric layer 205 is formed on the sidewalls of cavity 200 and then trench 105 and cavity 200 are filled with polysilicon 210 and a CMP process performed to planarize substrate 100 to form a buried dielectric collared trench capacitor 215. The CMP process may also remove silicon oxide layer 155 and second silicon nitride layer 135 over top surface 110 of substrate 100. Alternatively all or some of the dielectric layers in trench 105 may be removed and/or new dielectric layers formed on the sidewalls and bottom of the trench, then the trench filled with polysilicon and CMP process performed to planarize the surface of the substrate. In the case that trench capacitor is used in a DRAM cell, Pwell region 220 and N+ plate region 225 are illustrated in approximate positions relative to buried dielectric collar 180.

Thus, the present invention provides a scalable buried dielectric collar process and reduced leakage trench capacitor using a buried dielectric collar.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming a buried dielectric collar around a trench, comprising:
    (a) forming said trench in a substrate;
    (b) forming a multilayer coating on sidewalls and a bottom wall of said trench;
    (c) removing a continuous band of said multilayer coating from said sidewalls a fixed distance from a top of said trench to expose a continuous band of substrate in said sidewalls of said trench;
    (d) etching, in said exposed band of substrate, a lateral trench extending into said substrate in said sidewalls of said trench, continuous bands comprising three or more layers of said multilayer coating remaining above and continuous band comprising the same said three or more layers of said multilayer coating remaining below said lateral trench after said etching; and
    (e) filling said lateral trench with a dielectric material to form said buried dielectric collar.

2. The method of claim 1, wherein said buried dielectric collar extends continuously around said trench.

3. The method of claim 1, wherein said buried dielectric collar extends into said trench.

4. A method of forming a buried dielectric collar around a trench, comprising:
    (a) forming said trench in a substrate;
    (b) forming a multilayer coating on sidewalls and a bottom wall of said trench;
    (c) removing a continuous band of said multilayer coating from said sidewalls a fixed distance from a top of said trench to expose a continuous band of substrate in said sidewalls of said trench by defining a top edge of said band with a first recessed resist process; and
    defining a bottom edge of said band with a second recessed resist process;
    (d) etching, in said exposed band of substrate, a lateral trench extending into said substrate in said sidewalls of said trench, continuous bands comprising three or more layers of said multilayer coating remaining above and continuous band comprising the same said three or more layers of said multilayer coating remaining below said lateral trench after said etching; and
    (e) filling said lateral trench with a dielectric material to form said buried dielectric collar.

5. The method of claim 1, wherein said multilayer coating comprises in order from said substrate outward, a layer of silicon oxide, a first layer of silicon nitride, a layer of polysilicon and a second layer of silicon nitride.

6. The method of step (e) wherein said substrate includes silicon and said dielectric material is silicon oxide formed by oxidation of said substrate.

7. A method of forming a trench capacitor, comprising:
    (a) forming a trench in a substrate;
    (b) forming a multilayer coating on sidewalls and a bottom wall of said trench;
    (c) removing a continuous band of said multilayer coating from said sidewalls a fixed distance from a top of said trench to expose a continuous band of substrate in said sidewalls of said trench;
    (d) etching, in said exposed band of substrate, a lateral trench extending into said substrate in said sidewalls of said trench, continuous bands comprising three or more layers of said multilayer coating remaining above and continuous band comprising the same said three or more layers of said multilayer coating remaining below said lateral trench after said etching;
    (e) filling said lateral trench with a dielectric material to form said buried dielectric collar;
    (f) filling said trench with polysilicon.

8. The method of claim 7, wherein said buried dielectric collar extends continuously around said trench.

9. The method of claim 7, wherein said buried dielectric collar extends into said trench.

10. The method of claim 7, wherein step (c) comprises:
    defining a top edge of said band with a first recessed resist process; and
    defining a bottom edge of said band with a second recessed resist process.

11. The method of claim 7, wherein said multilayer coating comprises in order from said substrate outward, a layer of silicon oxide, a first layer of silicon nitride, a layer of polysilicon and a second layer of silicon nitride.

12. The method of claim 7 wherein in step (e) said substrate includes silicon and said dielectric material is silicon oxide formed by oxidation of said substrate.

13. The method of claim 7, further including between steps (e) and (f):
  removing remaining multilayer coating from said trench; and
  forming at least one dielectric layer on said sidewalls and bottom of said trench.

14. The method of claim 7, further including between steps (c) and (f):
  removing remaining multilayer coating from a portion of said bottom of said trench;
  etching said substrate to form an extension of said trench deeper into said substrate; and
  forming at least one dielectric layer on said sidewalls and bottom of said extension of said trench.

15. A method of following a buried dielectric collar around a trench, comprising:
  (a) forming said trench in silicon substrate;
  (b) forming a multilayer coating on sidewalls and a bottom of said trench, said multilayer coating comprises in order from said substrate outward, a layer of silicon oxide, a first layer or silicon nitride, a layer of polysilicon and a second layer of silicon nitride;
  (c) forming a first resist fill a first distance from a top of said trench;
  (c) removing said first silicon nitride layer not protected by said first resist fill exposing a upper portion of said polysilicon layer and oxidizing an outer layer of said upper portion of said polysilicon layer to form a second silicon oxide layer on said polysilicon layer and then removing said first resist fill;
  (f) forming a second resist fill a second distance from a top of said trench, said second distance being greater than said first distance;
  (g) removing in the order recited, (i) between said second silicon oxide layer and a top surface of said second fill resist, a continuous band of said second silicon nitride layer, a continuous band of said polysilicon layer, a continuous band of said first silicon nitride layer and a continuous band of said first silicon oxide layer to expose a continuous band of substrate in said sidewalls of said trench and said second resist fill or (ii) between said second silicon oxide layer and a top surface of said second fill resist, a continuous band of said second silicon nitride layer, a continuous band of said polysilicon layer and a continuous band of said first silicon nitride layer and then removing said second fill resist and said first silicon oxide layer to expose a continuous band of substrate in said sidewalls of said trench;
  (h) etching, in said exposed band of substrate, a lateral trench extending into said substrate in said sidewalls of said trench; and
  (i) filling said lateral trench with a dielectric material to form said buried dielectric collar.

16. The method of claim 15, wherein in step (g) said second resist fill is removed prior to removing said first silicon oxide layer.

17. The method of claim 15, wherein said buried dielectric collar extends continuously around said trench.

18. The method of claim 15, wherein said buried dielectric collar extends into said trench.

19. The method of claim 15, further including:
  (j) forming a third silicon nitride layer over all exposed surfaces of all, remaining layers on said sidewalls, said bottom of said trench and over portion of said buried dielectric collar in said lateral trench exposed in said trench; and
  (k) forming a third silicon oxide layer over said third silicon dielectric layer.

20. The method of claim 15, wherein exposed portions of said polysilicon layer adjacent to said lateral trench are removed when said lateral trench is formed and are filled with silicon oxide when said buried dielectric collar is formed.

* * * * *